US006172562B1

United States Patent
Cazaux et al.

(10) Patent No.: US 6,172,562 B1
(45) Date of Patent: Jan. 9, 2001

(54) DEVICE FOR CONTROLLING THE AMPLITUDE AND THE PHASE OF A RADIO FREQUENCY SIGNAL

(75) Inventors: Jean louis Cazaux, Toulouse; Régis Barbaste, Venerque; Bernard Cogo, Montrabe, all of (FR)

(73) Assignee: Alcatel, Paris (FR)

(*) Notice: Under 35 U.S.C. 154(b), the term of this patent shall be extended for 0 days.

(21) Appl. No.: 09/225,508

(22) Filed: Jan. 6, 1999

(30) Foreign Application Priority Data

Jan. 6, 1998 (FR) .................................................. 98 00032

(51) Int. Cl.[7] ...................................................... H03F 1/26
(52) U.S. Cl. ............................................ 330/149; 375/296
(58) Field of Search .................................. 330/149, 151; 375/296, 297

(56) References Cited

U.S. PATENT DOCUMENTS

| 4,068,186 | * | 1/1978 | Sato et al. | 330/149 |
| 5,015,965 | * | 5/1991 | Katz et al. | 330/149 |
| 5,258,722 | * | 11/1993 | Jeffers | 330/149 |
| 5,304,944 | * | 4/1994 | Copeland et al. | 330/149 |
| 5,576,660 | * | 11/1996 | Pouysegur et al. | 330/149 |
| 5,703,531 | * | 12/1997 | Vaughn et al. | 330/149 |

FOREIGN PATENT DOCUMENTS

| 0 658 975 A1 | 6/1995 | (EP) . |
| 0 675 594 A1 | 10/1995 | (EP) . |
| 0 682 406 A1 | 11/1995 | (EP) . |

OTHER PUBLICATIONS

Imai N. et al: "Novel Linearizer Using Balanced Circulators and Its Application to Multilevel Digital Radio Systems" IEEE Transaction on Microwave Theory and Techniques, vol. 37, No. 8, Aug. 1989, pp. 1237–1243, XP000038624.

* cited by examiner

Primary Examiner—Benny Lee
Assistant Examiner—Khanh Van Nguyen
(74) Attorney, Agent, or Firm—Sughrue, Mion, Zinn, Macpeak & Seas, PLLC

(57) ABSTRACT

A digital device for controlling the amplitude and the phase of a radio frequency signal includes a variable digital attenuator, a variable digital phase-shifter, and a distributor having one input and two outputs for dividing the radio frequency signal into a first signal part and a second signal part. A digital amplitude control first channel connected to an output of the distributor includes the variable digital attenuator for controlling the amplitude of the first signal part. A digital phase control second channel connected to the other output of the distributor in parallel with the first digital control channel includes the variable digital phase-shifter for controlling the phase of the second signal part. A recombiner has one output and two inputs respectively connected to the outputs of the two digital control channels and recombines the controlled two signal parts. Such devices include predistortion linearizers.

8 Claims, 4 Drawing Sheets

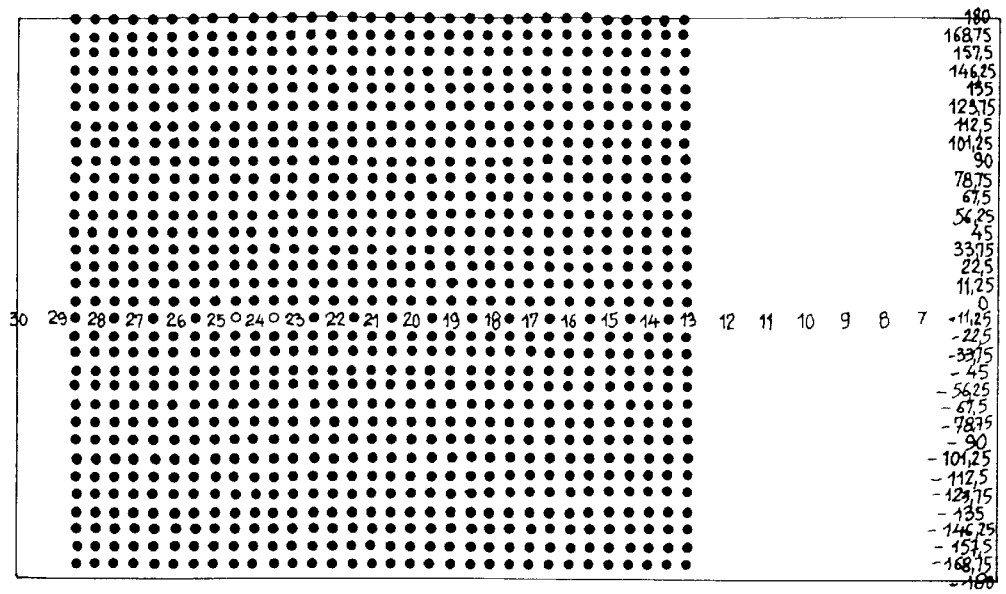
FIG_1  PRIOR ART
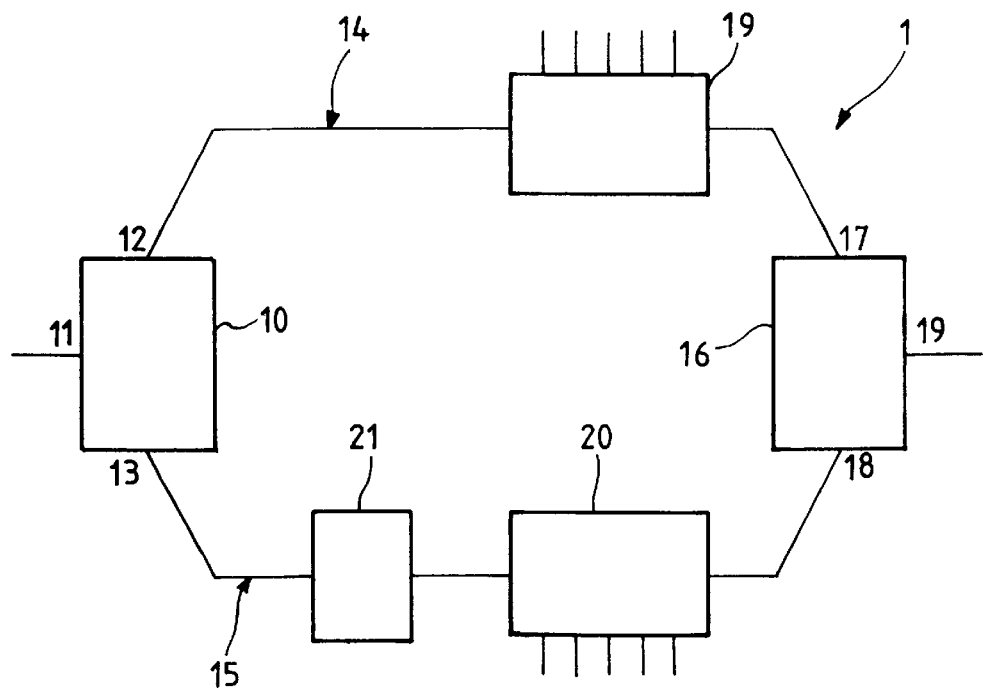
FIG_2

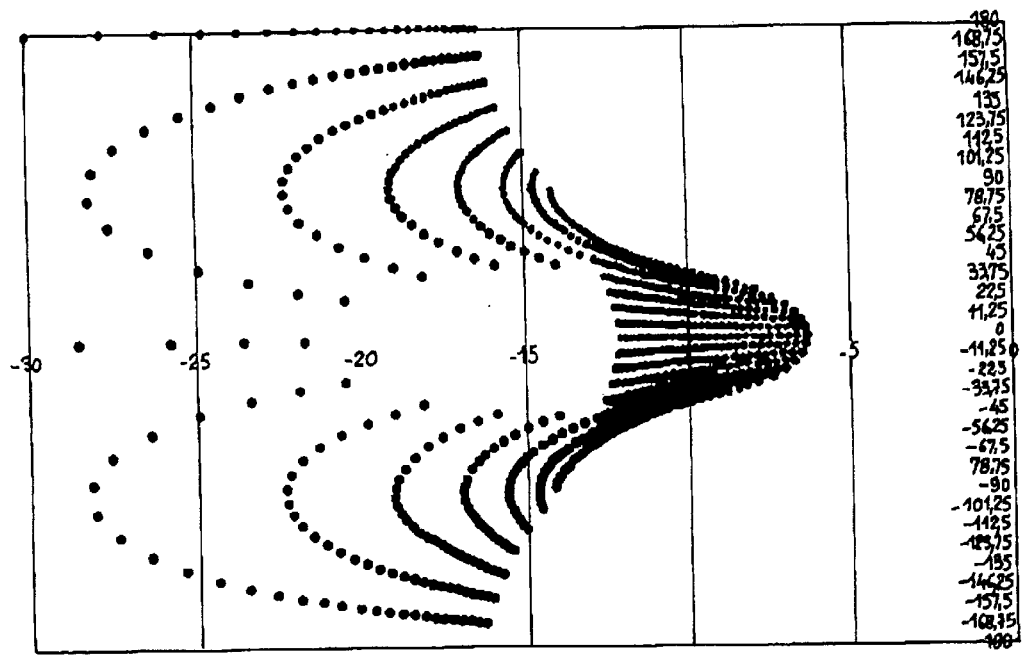
FIG_3
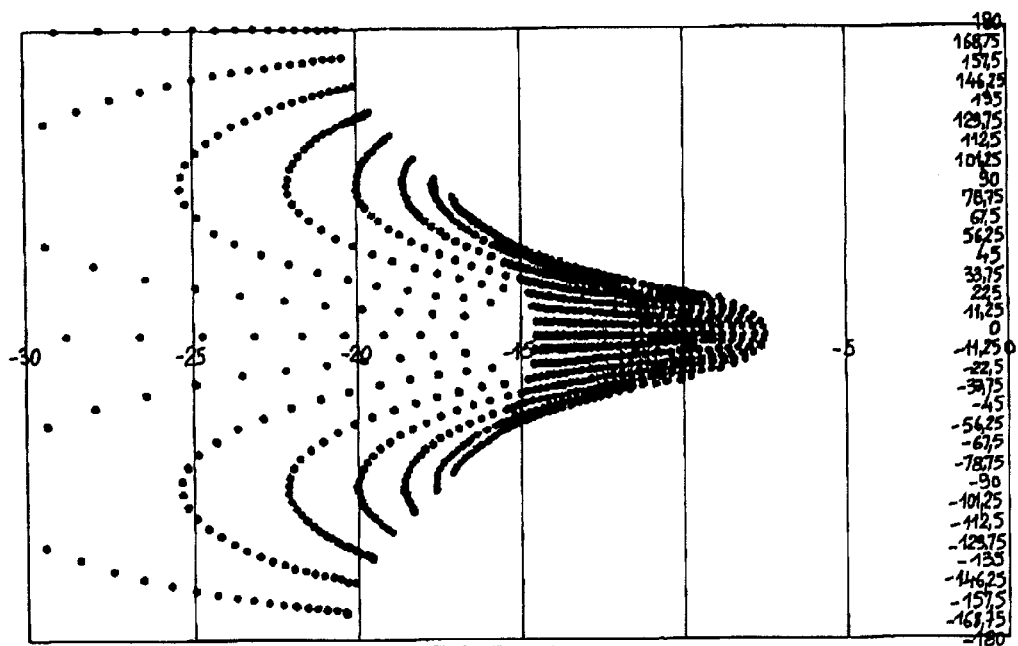
FIG_4

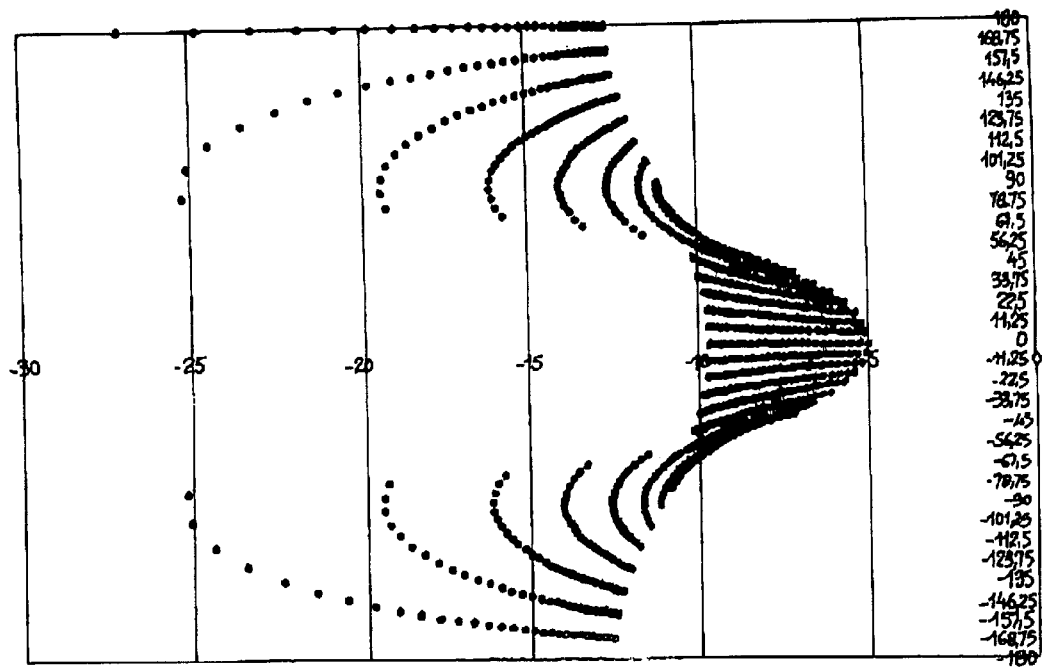
FIG_5
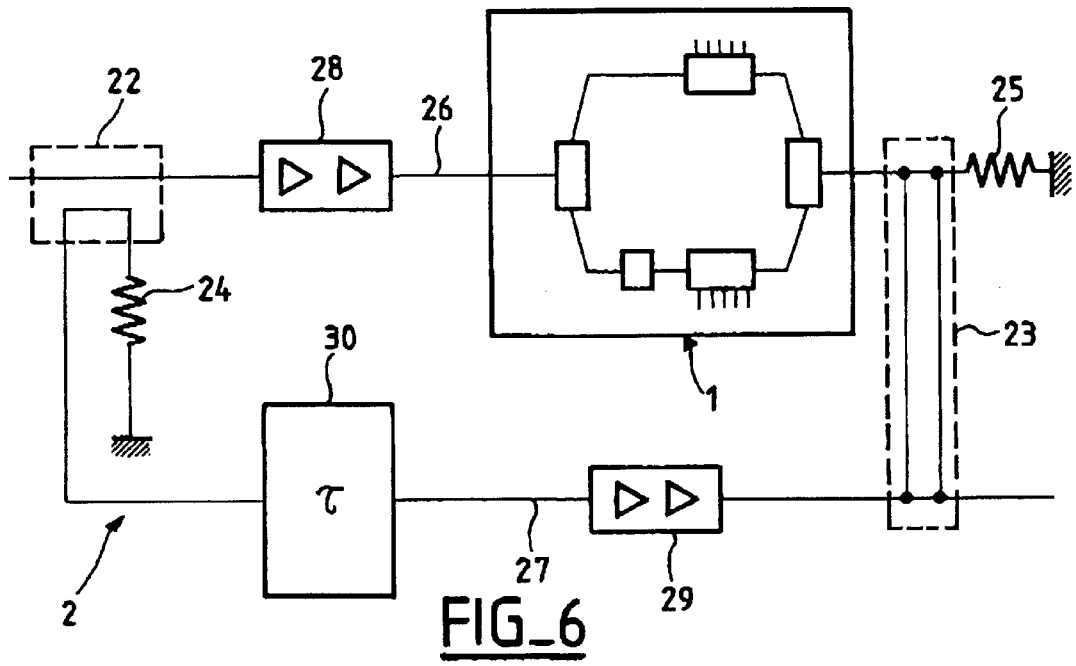
FIG_6

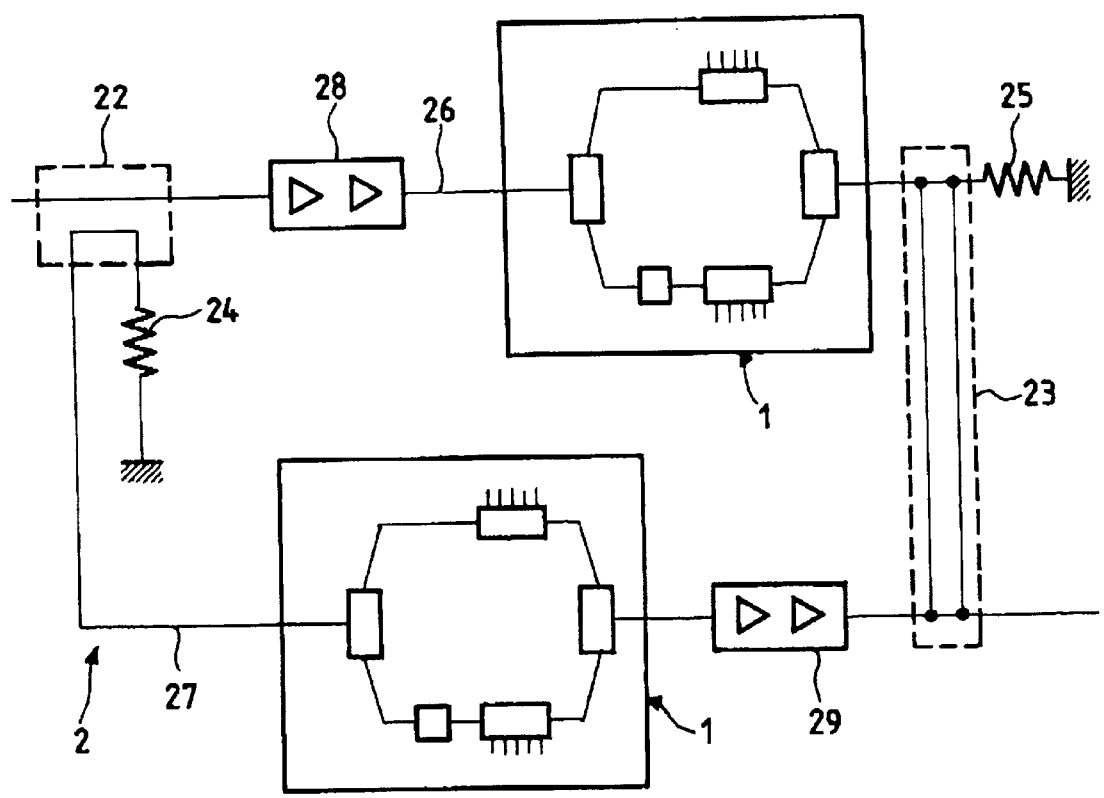
FIG_7

DEVICE FOR CONTROLLING THE AMPLITUDE AND THE PHASE OF A RADIO FREQUENCY SIGNAL

BACKGROUND OF THE INVENTION

1. Field of the Invention

The invention concerns a digital device for controlling the amplitude and the phase of a radio frequency signal, a pre-distortion linearizer including at least one such device and a digital method of controlling the amplitude and the phase of a radio frequency signal.

The invention applies in particular, although this is not limiting on the invention, to high-frequency pre-distortion linearizers used on the input side of travelling wave tubes (TWT) or solid state power amplifiers (SSPA) to linearize them.

2. Description of the Prior Art

The skilled person is well aware that it is necessary to use a linearizer to obtain good electrical efficiency of an amplifier, in particular a power amplifier, by having it operate near saturation. Near this operating point the linearity of the amplifier is strongly degraded relative to the linearity of the same amplifier used with signals of lower amplitude than those required to saturate the amplifier.

A non-linearity corrector device can be used to increase the dynamic range of an amplifier in linear operation without sacrificing the electrical efficiency obtained near saturation.

At microwave frequencies it is preferable to use a pre-distortion linearizer. This technique employs a coupler to extract a portion of the signal before it is amplified and which is then processed by various active and passive electronic components to obtain a non-linear correction signal having the same non-linearity characteristics as the wanted signal to be corrected but with the opposite phase. The predistortion linearizer supplies a correction signal with the signal to be amplified at the input of the microwave power amplifier whose non-linearities are to be corrected.

Predistorion linearizers of the above kind conventionally comprise a so-called linear channel including an amplifier operating with low level signals and a so-called non-linear channel including an amplifier generating non-linear distortion of the same amplitude as that of the power amplifier to be linearized.

For such linearizers it is necessary to adjust the phase difference and the amplitude difference of the signals propagated in the two channels.

Correct operation of the linearizer, i.e. obtaining correct pre-distortion, is conditioned by very fine control of the amplitude and phase differences.

The amplitude and the phase are controlled by analog or digital control circuits.

Analog control circuits achieve a high accuracy, in the order of one degree of phase and in the order of 0.1 dB of amplitude. However, they have the usual drawbacks of analog technology, in particular they are particularly sensitive to temperature variations, to input power level variations, and to control voltage variations and do not allow automation of setting up and measurement operations.

Furthermore, in most applications the circuits on the output or input side are digital circuits so that an analog/digital converter is required to connect them.

In the case of digital control circuits the use of a variable digital phase-shifter to control the phase connected in series with a variable digital attenuator for controlling the amplitude is known in itself. Accordingly, in the case of predistortion linearizers the association of an M-bit phase-shifter providing complete coverage of the phase plane (360°) and an N-bit attenuator having an amplitude control dynamic range of A dB achieves total coverage of 360 degrees of phase and A dB of amplitude with a resolution of $360°/2^M$ in phase and $A/2^N$ dB in amplitude. The number of control states obtained on an amplitude-phase plane is $2^{M+N}$ and they are uniformly distributed. FIG. 1 shows a distribution of the above kind in the case where M=N=5.

However, control accuracy is limited because it is directly related to the achievable value of the least significant bits of the attenuator and the phase-shifter.

For example, in the case of standard 6-bit digital phase-shifters providing complete coverage of the phase plane (360°) the greatest accuracy that can be achieved is 5.625°. Similarly, in the case of standard 6-bit digital attenuators having an amplitude control dynamic range of 32 dB the greatest accuracy that can be obtained is 0.5 dB.

To improve control accuracy, consideration might be given to increasing the number of bits available by dividing the value of the least significant bit. For example, an 8-bit phase-shifter would be four times more accurate than a 6-bit phase-shifter. However, currently available technology, especially in the microwave domain, cannot reproducibly provide digital circuits having a sufficient number of bits to obtain such accuracy.

Furthermore, the cost of any specific implementation of such a circuit is prohibitive.

The aim of the invention is therefore to alleviate the drawbacks previously mentioned.

It concerns a device and a method for controlling a radio frequency signal achieving an accuracy at least equivalent to that achieved by analog circuits combined with the advantages of digital technology, including:

temperature stability;

operation over a wide frequency range;

very low sensitivity to unwanted variations in control voltages due, for example, to aging or to electromagnetic interference; and simple automation of setting up and measurement operations.

SUMMARY OF THE INVENTION

To this end, in a first aspect, the invention proposes a digital device for controlling the amplitude and the phase of a radio frequency signal, induding a variable digital attenuator, a variable digital phase-shifter, distributor means having one input and two outputs for dividing the radio frequency signal into a first signal part and a second signal part, a digital amplitude control first channel connected to an output of the distributor means and including the variable digital attenuator for controlling the amplitude of the first signal part, a digital phase control second channel connected to the other output of the distributor means in parallel with the first digital control channel and including the variable digital phase-shifter for controlling the phase of the second signal part, and recombiner means having one output and two inputs respectively connected to the outputs of the two digital control channels for recombining the controlled two signal ports.

The respective contributions of the two signal parts on the two digital control channels procure a much smaller coverage in phase and in amplitude but retain a number of states identical to the prior art series configuration. This achieves better accuracy, in the order of two degrees of phase and 0.25 dB of amplitude, without modifying digital circuits available off the shelf.

Furthermore, the global insertion losses due to a device of the above kind are lower than those obtained with prior art devices.

In one embodiment the digital control device further comprises attenuator means connected in series with at least one of said digital control channels for adjusting the difference between respective insertion losses of said variable digital attenuator and said variable digital phase-shifter.

In a second aspect the invention proposes a predistortion linearizer having a linear channel and a non-linear channel connected in parallel at an input to an input coupler and at an output to on output coupler, the linearizer including at least one digital control device in accordance with the invention connected in series in one channel.

Using a control device in accordance with the invention allows very accurate control of the gain and the phase of the linear and non-linear channels to assure correct operation of the linearizer combined with the advantages of digital technology.

In a third aspect the invention proposes a digital method of controlling the amplitude and the phase of a radio frequency signal including the following steps:

a) dividing the radio frequency signal into a first signal part and a second signal part;
 b) digitally controlling the amplitude of the first or second signal part;
 c) digitally controlling the phase of the second or first signal part; and
 d) recombining the controlled signal part to form a radio frequency signal with controlled phase and amplitude.

In accordance with another feature of the invention steps b) and c) are performed simultaneously.

Also, the radio frequency signal can be divided into two identical signal parts.

Other features of the invention are explained in the following non-limiting description of embodiments of the invention with reference to the accompanying drawings.

BRIEF DESCRIPTION OF THE DRAWINGS

FIG. 1 is a representation in a phase-amplitude plane of the distribution of control states obtained with a prior art series configuration.

FIG. 2 is a block diagram of a control device in accordance with the invention.

FIG. 3 is a representation in a phase-amplitude plane of the distribution of control states obtained by simulating the control device in accordance with the invention with no fixed attenuator.

FIG. 4 is a representation in a phase-amplitude plane of the distribution of control states obtained by simulating the control device in accordance with the invention with a −3 dB fixed attenuator in the second channel.

FIG. 5 is a representation in a phase-amplitude plane of the distribution of control states obtained by simulating the control device in accordance with the invention with a +3 dB fixed attenuator in the first channel.

FIG. 6 is a block diagram of a first embodiment of a linearizer in accordance with the invention.

FIG. 7 is a block diagram of a second embodiment of a linearizer in accordance with the invention.

DETAILED DESCRIPTION OF THE PREFERRED EMBODIMENTS

The control device described hereinafter is used in the context of an application to microwave signals. However, the invention is not limited to this frequency domain and can be applied in general to any radio frequency signal.

The control device 1 shown in FIG. 2 includes a distributor 10 such as a hybrid coupler, for example, with one input 11 and two outputs 12 and 13, two digital control channels 14 and 15 and a recombiner 16 such as a hybrid coupler with two inputs 17 and 18 and one output 19.

The two control channels 14 and 15 are respectively connected in parallel between the outputs 12 and 13 of the distributor 10 and the inputs 17 and 18 of the recombiner 16. The first channel 14 is an amplitude control channel. It includes an N-bit variable digital attenuator 19 having an amplitude control dynamic range of A dB and insertion losses of n dB. The second channel 15 is a phase control channel. It includes an M-bit variable digital phase-shifter 20 providing complete coverage of the phase plane, i.e. 360°, and insertion losses of m dB. Generally, m is greater than n.

The distributor 10 receives the signal to be controlled at its input 11 and divides it into two signal parts. In the embodiment described the two signal parts are identical. They could of course be different. A first signal part is transmitted and controlled in the amplitude control channel 14 and a second signal part in the phase control channel 15. The two signal parts with their amplitude and their phase, respectively, controlled are recombined in the recombiner 16 which performs a vector sum.

The number of control states remains unchanged compared to that of the prior art because the digital circuits are not modified but the control states are distributed over a smaller total coverage because the phase and amplitude of only a part of the signal are controlled. Consequently, the accuracy is improved over the reduced total coverage. FIG. 3 shows one example of the distribution obtained by simulation for M=N=5, n=−5 dB and m=−8 dB.

As will be explained in the remainder of the description, for applications with which the invention is concerned this reduction in the total phase and amplitude coverage is not limiting because control is effected over a scale of a few degrees and a few dB.

The amplitude of the total coverage can be modified by modifying the insertion loss difference of the two control channels.

To this end, in one embodiment of the invention the control device 1 further includes a fixed attenuator 21 connected in series into either control channel for adjusting the insertion loss difference between the two channels.

In a preferred embodiment of the invention shown in FIG. 2 the fixed attenuator 21 is in the phase control channel 15, in series with and on the input side of the phase-shifter 20. FIGS. 4 and 5 show examples of the distribution of the control states obtained by simulation for fixed +3 dB attenuators in the phase control channel 15 and the amplitude control channel 14, respectively.

The control device 1 in accordance with the invention is intended to form part of a predistortion linearizer and to improve its phase and amplitude control accuracy.

To this end the invention further proposes a linearizer including at least one control device of the type previously described.

The predistortion linearizer 2 of FIGS. 6 and 7 is designed to be placed immediately on the input side of a power amplifier (not shown) to assure simultaneous amplitude and phase distortion of the signal applied to it, the distortion being complementary to that being generated by the power amplifier, in order to compensate the latter.

In the examples shown the predistortion linearizer includes two hybrid couplers 22 and 23 terminated by respective matched loads 24 and 25 and two transmission lines 26 and 27, respectively a non-linear channel 26 and a linear channel 27.

The signal to be amplified is fed to the input E of the linearizer whence it is fed to the input of the coupler 22. The signal is therefore divided into two parts that are fed to respective inputs of the two transmission lines 26 and 27. In the conventional way the coupler 22 introduces a phase shift between the two signals supplied at the output to the two transmission lines. The coupler 22 can be a 10 dB hybrid coupler, for example, which introduces a phase shift of 90°.

The non-linear channel 26 includes an amplifier 28 generating non-linear amplitude distortion of the same kind as the power amplifier to be linearized and the linear channel 27 includes a low-level signal amplifier 29.

In accordance with the invention the linearizer 2 further includes a control device 1 either on the channel 26 or on the channel 27 of the linearizer, preferably on the non-linear channel 26, as shown in FIG. 6. In this embodiment the control device 1 is connected in series with and on the output side of the amplifier 28.

The signals on the two channels are then added by the coupler 23. The predistortion correction signal is supplied at the output S of the coupler 23 to a microwave power amplifier (not shown). In the conventional way the coupler 23 introduces a phase shift between the two signals supplied to its inputs by the two transmission lines 26 and 27 before summing them. The coupler 23 can be a 3 dB hybrid coupler, for example, which introduces a phase shift of 90°.

In one embodiment it is preferable for the two channels to have the same electrical length so that the transfer function of the linearizer is substantially independent of frequency so that the linearizer can operate over a very wide frequency band.

To this end, in a first embodiment, the linearizer 2 includes a second control device 1, as shown in FIG. 7, connected to the linear channel 27 in series with and on the input side of the amplifier 29, to balance the group delay times of the two channels 26 and 27.

The two channels of the linearizer can of course be controlled differently, or just one of them could be controlled. In the latter case the control device of the other channel is present only to balance the group delay times of the two channels and is inactive in the sense that it does not control in any way the signal part on that channel.

In a different embodiment, shown in FIG. 6, the second control device is replaced by a delay line 30.

The linearizer described hereinabove with reference to FIGS. 6 and 7 therefore has a predetermined phase shift of 180° between the two channels, the predetermined phase shift resulting entirely from the phase shifts introduced by the two couplers 22 and 23.

As the skilled person is well aware, the relative phase shift $\Delta\phi$ of the signals on the linear channel and the non-linear channel of a linearizer providing an overall transfer function corresponding to a travelling wave tube used as a microwave power amplifier is in the order of $\Delta\phi \approx -170°$, with an amplitude difference between the two channels in the order of 3 dB. For a solid state microwave power amplifier, on the other hand, the relative phase shift of the signals on the two channels is in the order of $\Delta\phi \approx +170°$.

In this embodiment the two channels are therefore inherently controlled to operate very near the optimum point, which is defined by: $\Delta\phi \approx \pm 170°$, $\Delta V \approx 3$ dB. The required final adjustment of the phase difference or the amplitude difference of the signals propagating in the linear and non-linear channels must therefore be effected by the control device 1 over a range of a few degrees and a few dB.

Consequently the total control coverage achieved by the control device of the invention is entirely suitable, even though reduced in size.

The circuits constituting the control device and the linearizer in accordance with the invention can be implemented using standard techniques known to the skilled person, in particular the MMIC or MIC technologies. The circuits can be manufactured collectively or individually and thereafter connected by microstrips circuits or using hybrid technology.

Finally, the invention concerns a digital method of controlling the amplitude and the phase of a radio frequency signal using a control device as previously described.

As follows from the foregoing description, the method includes the following steps:
a) dividing the radio frequency signal into a first signal part and a second signal part;
b) digitally controlling the amplitude of the first or second signal part;
c) digitally controlling the phase of the second or first signal part; and
d) recombining the two controlled signal parts to form a radio frequency signal with controlled phase and amplitude.

In the embodiment previously described the radio frequency signal is divided into two identical signal parts and steps b) and c) are effected simultaneously.

There is also a step of balancing the insertion losses occurring in steps b) and c).

Further, step d) is a vector addition of the two controlled signal ports.

Of course, the invention is not limited to the examples previously described but can be applied to other embodiments, for example to the control of active scanning antennas, or to any embodiment using one or more means equivalent to the means described herein to fulfil the same functions to obtain the same results.

More generally, the invention concerns any application necessitating accurate numerical control of a phase/amplitude transfer function.

There is claimed:

1. A predistortion linearizer having a linear transmission channel and a non-linear transmission channel connected in parallel at an input to an input coupler and at an output to an output coupler, said linearizer including at least one digital control device connected in series in one transmission channel, said digital control device controlling the amplitude and phase of a radio frequency signal, and comprising:

a variable digital attenuator;

a variable digital phase-shifter;

distributor means having one input and two outputs for dividing said radio frequency signal into a first signal part and a second signal part;

a digital amplitude control first channel connected to an output of said distributor means and including said variable digital attenuator for controlling the amplitude of said first signal part;

a digital phase control second channel connected to another output of said distributor means in parallel with said first digital control channel and including said variable digital phase-shifter for controlling the phase of said second signal part; and recombiner means having one output and two inputs respectively connected to outputs of said two digital control channels for recombining the controlled two signal parts.

2. The predistortion linearizer claimed in claim 1 wherein said distributor means include a divider adapted to divide said radio frequency signal into two identical signal parts.

3. The predistortion linearizer as claimed in claim 1 further including attenuator means connected in series with at least one of said digital control channels for adjusting the difference between respective insertion losses of said variable digital attenuator and said variable digital phase-shifter.

4. The predistortion linearizer claimed in claim 3 wherein said attenuator means are in said first digital control channel on the input side of said variable digital phase-shifter.

5. The predistortion linearizer claimed in claim 3 wherein said attenuator means include a fixed attenuator.

6. The predistortion linearizer claimed in claim 1 wherein said digital control device is in said non-linear channel.

7. A predistortion linearizer as claimed in claim 1 further including a delay line in series in the other transmission channel.

8. The predistortion linearizer as claimed in claim 1; including another said digital control device connected in series in the other transmission channel of said linearizer, one of said control devices being adapted to balance group delay times of said two transmission channels of said linearizer.

* * * * *